(12) United States Patent
Khan et al.

(10) Patent No.: US 8,338,273 B2
(45) Date of Patent: Dec. 25, 2012

(54) PULSED SELECTIVE AREA LATERAL EPITAXY FOR GROWTH OF III-NITRIDE MATERIALS OVER NON-POLAR AND SEMI-POLAR SUBSTRATES

(75) Inventors: M. Asif Khan, Irmo, SC (US); Vinod Adivarahan, Columbia, SC (US)

(73) Assignee: University of South Carolina, Columbia, SC (US)

( * ) Notice: Subject to any disclaimer, the term of this patent is extended or adjusted under 35 U.S.C. 154(b) by 483 days.

(21) Appl. No.: 12/515,991

(22) PCT Filed: Dec. 17, 2007

(86) PCT No.: PCT/US2007/087751
§ 371 (c)(1),
(2), (4) Date: Jan. 20, 2010

(87) PCT Pub. No.: WO2009/002365
PCT Pub. Date: Dec. 31, 2008

(65) Prior Publication Data
US 2010/0140745 A1    Jun. 10, 2010

Related U.S. Application Data

(60) Provisional application No. 60/875,009, filed on Dec. 15, 2006.

(51) Int. Cl.
*H01L 21/28* (2006.01)
(52) U.S. Cl. .............. 438/478; 257/E21.279; 117/105
(58) Field of Classification Search ........... 257/E21.108, 257/E21.279; 117/105; 438/46, 478, 483
See application file for complete search history.

(56) References Cited

U.S. PATENT DOCUMENTS

| 5,705,443 | A | 1/1998 | Stauf et al. |
| 5,779,926 | A | 7/1998 | Ma et al. |
| 6,233,267 | B1 * | 5/2001 | Nurmikko et al. ....... 372/46.014 |
| 6,277,219 | B1 | 8/2001 | Heinz et al. |
| 6,521,961 | B1 | 2/2003 | Costa et al. |
| 6,825,134 | B2 | 11/2004 | Law et al. |
| 2002/0031851 | A1 * | 3/2002 | Linthicum et al. ............. 438/22 |
| 2003/0188682 | A1 * | 10/2003 | Tois et al. ...................... 117/105 |
| 2004/0224484 | A1 * | 11/2004 | Fareed et al. ................. 438/478 |
| 2005/0168127 | A1 * | 8/2005 | Shei et al. ..................... 313/487 |
| 2005/0183658 | A1 | 8/2005 | Nakahata et al. |

OTHER PUBLICATIONS

Fareed et al., "Vertically Faceted Lateral Overgrowth of GaN on SiC with Conducting Buffer Layers Using Pulsed Metalorganic Chemical Vapor Deposition", Applied Physics Letters, vol. 77, No. 15, Oct. 9, 2000, pp. 2343-2345.

Zhang et al., "Pulsed Atomic Layer Epitaxy of Quaternary AlInGaN Layers", Applied Physics Letters, vol. 79, No. 7, Aug. 13, 2001.

Zhang et al., "Pulsed Atomic-Layer Epitaxy of Ultrahigh-Quality $Al_xGa_{1-x}N$ Structures for Deep Ultraviolet Emissions Below 230 nm", Applied Physics Letters, vol. 81, No. 23, Dec. 2, 2002, pp. 4392-4394.

* cited by examiner

*Primary Examiner* — Thomas L Dickey
(74) *Attorney, Agent, or Firm* — Dority & Manning, P.A.

(57) ABSTRACT

An epitaxy procedure for growing extremely low defect density non-polar and semi-polar III-nitride layers over a base layer, and the resulting structures, is generally described. In particular, a pulsed selective area lateral overgrowth of a group III nitride layer can be achieved on a non-polar and semi-polar base layer. By utilizing the novel P-MOCVD or PALE and lateral over growth over selected area, very high lateral growth conditions can be achieved at relatively lower growth temperature which does not affect the III-N surfaces.

20 Claims, 9 Drawing Sheets

US 8,338,273 B2

PULSED SELECTIVE AREA LATERAL EPITAXY FOR GROWTH OF III-NITRIDE MATERIALS OVER NON-POLAR AND SEMI-POLAR SUBSTRATES

PRIORITY INFORMATION

The present application claims priority to U.S. Provisional Patent Application No. 60/875,009 filed on Dec. 15, 2006, naming Asif Khan, Qhalid Fareed, and Vinod Adivarahan as inventors, which is incorporated by reference herein in its entirety.

GOVERNMENT SUPPORT CLAUSE

The present invention was developed with funding from the U.S. Army Space and Missile Defense Command under contract no. DASG60-02-1-0002. The government retains certain rights in the invention.

BACKGROUND OF THE INVENTION

Group III-nitride and its ternary and quaternary compounds are prime candidates for fabrication of visible and ultraviolet high-power and high-performance optoelectronic devices and electronic devices. These devices are typically grown epitaxially as thin films by growth techniques including molecular beam epitaxy (MBE), metalorganic chemical vapor deposition (MOCVD), or hydride vapor phase epitaxy (HVPE). The selection of substrates is critical for determining the III-Nitride growth direction. Some of the most widely used substrates for nitride growth include SiC, $Al_2O_3$, and $LiAlO_2$. III-N and its alloys are most stable in the hexagonal würtzite crystal structure, in which the crystal is described by two (or three) equivalent basal plane axes that are rotated 120° with respect to each other (the a-axes), all of which are perpendicular to a unique c-axis. Due to the relative ease of growing planar Ga-face c-planes, virtually all GaN-based devices are grown parallel to the polar c-axis. A negative consequence of this growth direction is that each layer material will suffer from segregation of electrons and holes to opposite faces of the layers due to the spontaneous polarization of the crystal. Furthermore, strain at the interfaces between adjacent layers gives rise to piezoelectric polarization, causing further charge separation within quantum heterostructures. Such polarization effects decrease the likelihood that electrons and holes will interact, a necessity for the operation of light-emitting optoelectronic devices.

One possible approach to eliminating the piezoelectric polarization effects in GaN optoelectronic devices is to grow the devices on non-polar planes of the crystal. Such planes contain equal numbers of Ga and N atoms and are charge-neutral. Furthermore, subsequent non-polar layers are equivalent to one another so the bulk crystal will not be polarized along the growth direction. Such symmetry-equivalent planes in III-N (such as a-plane, m-plane and r-plane) are collectively called as non-polar planes. In addition to these non-polar planes, semi-polar plane III-nitride layers and substrates are also possible. Growth on such non-polar and semi-polar planes substrates could yield significantly enhanced device performance compared to equivalent devices grown on c-plane GaN. Thus, the resulting electronic devices, such as high electron mobility transistors; or optoelectronic devices, such as visible and ultraviolet laser diodes and light-emitting diodes may be more efficient and less power consuming.

However, when non-polar III-Nitride layers are deposited on sapphire substrates, threading dislocations, as well as basal stacking faults, are generated due to lattice mismatch. These extended defects observed in the gallium nitride layers are predominantly threading dislocations and basal stacking faults (BSFs), which originate from the GaN/sapphire interface. The threading dislocation density and stacking fault does not appear to decrease with conventional metalorganic chemical vapor deposition and hydride vapor phase epitaxy deposition techniques. Typical threading dislocation densities are of the order of $1\times10^9$ $cm^{-2}$ and stacking fault are in the range of $5\times10^5$ $cm^{-2}$. Besides high defect density, nonpolar GaN grown on the sapphire surface also has rougher surfaces.

In conventional MOCVD the precursors (such tri-methyl gallium, ammonia etc.) are supplied continuously to the reactant chamber. This adduct formation during MOCVD also hampers the subsequent epilayer growths by increasing the number of stacking faults and dislocation density. A novel pulsed metal organic chemical vapor deposition (P-MOCVD) or pulsed atomic layer epitaxy (PALE) in which the precursors are supplied with alternative supply of sources alleviates the above mentioned problem. This alternative or pulsing technique not only suppress the adduct formation but also provides a unique opportunity to bend the dislocation propagation, to deposit monolayers of material thereby decreasing the slip (which is often the reason for stacking fault generation). Thus, P-MOCVD makes an attractive technique for substrate and epilayer growth and device fabrication.

Although the P-MOCVD alleviates some of the potential problems plaguing III-N devices (especially over non-polar substrates and materials) and represents an enabling technology for the growth of non-polar III-N devices, the relatively high defect density in the directly-grown non-polar or semi-polar III-N films reduces the efficiency of subsequently grown devices compared to what could be achieved by homoepitaxial growth on a perfect substrate. There is an ever-increasing effort to reduce the dislocation density in GaN films in order to improve device performance.

The primary means of achieving reduced dislocation and stacking fault densities in polar c-plane GaN films is the use of a variety of lateral overgrowth techniques, including lateral epitaxial overgrowth (LEO, ELO, or ELOG), selective area epitaxy, and Pendeo epitaxy. The essence of these processes is to block or discourage dislocations from propagating perpendicular to the film surface by favoring lateral growth over vertical growth. These dislocation-reduction techniques have been extensively developed for c-plane GaN growth by HVPE and MOCVD. These conventional growth techniques require a high temperature to accommodate the lateral growth for complete coalescence. This high temperature then subsequently brings in additional problems such as material decomposition, mask auto-doping etc.

However, a need exists for methods of growing high-quality, low-defect density non-polar and semi-polar III-N films.

SUMMARY OF THE INVENTION

Objects and advantages of the invention will be set forth in part in the following description, or may be obvious from the description, or may be learned through practice of the invention.

In general, the present disclosure is directed toward a method of growing a non-polar or semi-polar group III nitride layer on a base layer. First, a base layer (e.g., a group III nitride epilayer) is masked with a first dielectric layer such that the first dielectric layer is located on select areas of the base layer to leave a portion of the base layer is exposed. A mushroom-shaped PLOG group III nitride layer is grown via pulse lateral overgrowth epitaxy on the portion of the base layer that is exposed such that the PLOG group III nitride layer grows over a portion of the first dielectric layer. Then, the mushroom-shaped PLOG group III nitride layer is masked with a second dielectric layer such that each side of the mushroom-shaped PLOG group III nitride layer remains exposed. Finally, a nonpolar or semi-polar group III nitride layer is grown from each exposed side of the mushroom-shaped PLOG group III nitride layer by pulsing a nitrogen source and a group III metal source.

In another embodiment, the present invention is directed toward non-polar and semi-polar substrates having a PSALE group III nitride layer. The substrate can include a non-polar or semi-polar material having an overlying buffer layer and group III nitride base layer. A first dielectric layer masks a portion of the group III nitride base layer, leaving a portion of the group III nitride base layer unmasked. A mushroom-shaped PLOG group III nitride layer overlies the unmasked portion of the group III nitride base layer such that the mushroom-shaped PLOG group III nitride layer overgrows a portion of the first dielectric layer. A second dielectric layer masks the mushroom-shaped PLOG group III nitride layer leaving each side of the mushroom-shaped PLOG group III nitride layer unmasked. A nonpolar or semi-polar group III nitride layer overlies exposed portions of the first dielectric layer and the second dielectric layer. The nonpolar or semi-polar group III nitride layer is grown out of each unmasked side of the mushroom-shaped PLOG group III nitride layer.

Other features and aspects of the present invention are discussed in greater detail below.

BRIEF DESCRIPTION OF FIGURES

A full and enabling disclosure of the present invention, including the best mode thereof to one skilled in the art, is set forth more particularly in the remainder of the specification, which includes reference to the accompanying figures, in which.

Figure 1:
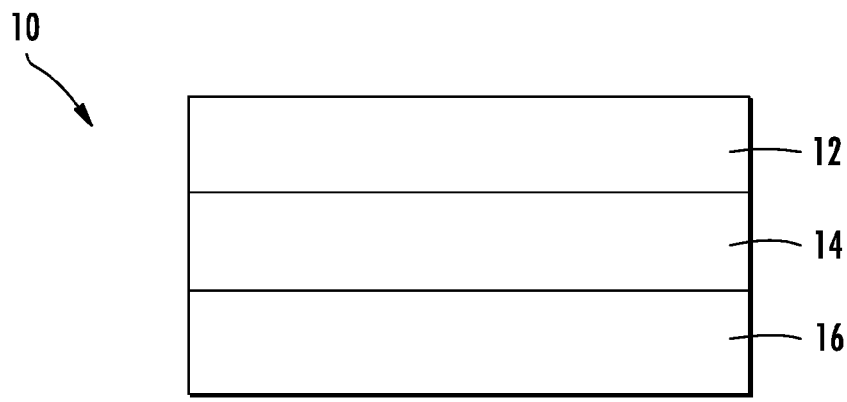
FIG. 1 shows an exemplary substrate having a group III nitride epilayer.

Repeat use of reference characters in the present specification and drawings is intended to represent the same or analogous features or elements of the present invention.

DETAILED DESCRIPTION OF PREFERRED EMBODIMENTS

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

In general, the present disclosure is directed to an epitaxy procedure for growing extremely low defect density non-polar and semi-polar III-nitride layers over a base layer, and the resulting structures. In particular, a pulsed selective area lateral overgrowth of a group III nitride layer can be achieved on a non-polar and semi-polar base layer.

By utilizing the novel P-MOCVD or PALE and lateral over growth hereby called as "Pulsed lateral overgrowth (FLOG)" over selected area, very high lateral growth conditions can be achieved at relatively lower growth temperature which does not affect the surfaces. Moreover, the pulsing gives additional facet control which ensures the proper coalescence of growth fronts to help avoid wing tilt which can be detrimental for epilayer growth. The PLOG technique combined with selective area lateral epitaxy (referred to as P-SALE) for III-N has not previously been accomplished.

I. Non-Polar and Semi-Polar Materials

According to the present invention, the group III nitride epilayer to be selectively doped can be formed on any suitable non-polar or semi-polar base layer. Suitable base layers can include materials such as but are not limited to, sapphire, silicon carbide, lithium aluminate, spinel, gallium nitride, aluminum nitride, aluminum gallium nitride, indium gallium nitride, aluminum indium gallium nitride, and the like. In one particular embodiment, the base layer is in the form of a substrate. Any suitable non-polar or semi-polar substrate can be used as the base layer to grow the group III nitride epilayer. Although the following description discusses a "substrate", other types of base layers can be used in accordance with the present invention.

Non-polar substrates generally encompass those grown in a-plane, r-plane, or m-plane. For example, the non-polar substrate can be an m-face or r-plane sapphire substrate such that there is no polarization charge supplied in the device layers of this structure.

Non-polar and semi-polar III-Nitride substrates are of great interest to the nitride semiconductor device community because they enable the deposition of improved device active regions that can be used to realize new and improved high performance optoelectronic and electronic nitride semiconductor devices. Some theoretical predictions believe that non-polar and semi-polar GaN will enable higher quantum efficiencies and improved electrical characteristics for light emitting diodes (LEDs) and laser diodes and will enable the development of very high performance enhancement mode (e-mode) high electron mobility transistors (HEMTs). While such predictions have been partially corroborated by experiment, previous attempts to fabricate devices on non-polar GaN were severely hampered by the presence of very high defect densities in the active regions which had origins in the substrates and which derived from the heteroepitaxial approaches used in the non-native approach to their fabrication.

II. Epilayer Growth

No matter the starting base layer for forming the substrate, a group III nitride epilayer is grown over the base layer. "Group III nitride" refers to those semiconducting compounds formed between elements in Group III of the periodic table and nitrogen. More preferably the Group III element is selected from the group consisting of aluminum (Al), gallium (Ga), and/or indium (In). Ternary and quaternary compounds (e.g., AlGaN and AlInGaN) are particularly preferred. As is well understood in the art, the Group III elements can combine with nitrogen to form binary compounds (e.g., GaN, AlN and InN), ternary compounds (e.g., AlGaN, AlInN, and GaInN), and quaternary compounds (i.e., AlInGaN).

The group III nitride epilayer can be composed of any combination of group III elements (e.g., Al, In, and Ga) and nitride. In one particular embodiment, the group III-nitride epilayer can be represented by the formula $Al_xIn_yGa_{1-x-y}N$, wherein $0 \leq x \leq 1$, $0 \leq y \leq 1$ and $0 < x+y \leq 1$. In employing growth techniques to grow the group III nitride epilayer, the precursor sources typically include a metal-organic source (e.g., trimethyl aluminum, trimethyl gallium, triethyl gallium, trimethyl indium), a nitrogen source (e.g., ammonia), a carrier gas (e.g., hydrogen and/or nitrogen), and an optionally doping source (e.g., silane, biscyclopentadienyl magnesium, etc.). Of course, other materials can be utilized to grow the group III nitride epilayer, and the present invention is not intended to be limited by the above listed materials. For example, another type of a metal-organic source and/or a nitrogen source can be utilized to grow the group III nitride epilayer.

The group III nitride epilayer can be applied on a substrate using any suitable technique, including but not limited to, metalorganic chemical vapor deposition (MOCVD), hydride vapor phase epitaxy (HVPE), molecular beam epitaxy (MBE), metalorganic hydride vapor phase epitaxy (MOHVPE), pulsed atomic layer epitaxy (PALE) growth technique, pulsed lateral overgrowth techniques (PLOG) (useful for growth of a group III nitride epilayer on a patterned wafer), or any combination of any of the deposition methods.

Pulse atomic layer epitaxy (PALE) allows accurate control of the quaternary layer composition and thickness by simply changing the number of aluminum, indium, and gallium pulses in a unit cell and the number of unit cell repeats. By controlling the pulse time, pulse condition, flow rate, and therefore chemical availability, the systematic growth provides a layer with significant control of the composition, thickness and crystalline quality. (J. Zhang et al., Applied Physics Letters, Vol. 79, No. 7, pp. 925-927, 13 Aug. 2001, J. P. Zhang et al. Applied Physics Letters, Vol. 81, No. 23, pp. 4392-4394, 2 Dec. 2002).

Pulsed lateral overgrowth (PLOG) is a technique wherein a Group III comprising material (e.g., triethyl gallium or trialkly aluminum) and a nitrogen material (e.g., ammonia) are supplied in a vapor phase for deposition of the Group III nitride. With pulsed lateral overgrowth the flow rate of the Group III material is maintained at a constant rate whereas the flow rate of the nitrogen compound is systematically altered, preferable from full flow to off, in a predetermined sequence as set forth in "Vertically Faceted Lateral Overgrowth of GaN on SiC with Conducting Buffer Layers Using Pulsed Metalorganic Chemical Vapor Deposition", Fareed et al., *Applied Physics Letters*, Vol. 77, Number 15, 9 Oct. 2000, page 2343-5, which is incorporate by reference herein. By controlling the flow rate, and therefore chemical availability, of the nitrogen systematic growth of select crystallographic planes can be accomplished. The systematic growth provides a layer which significantly mitigates transfer of dislocations caused by lattice mismatches through the layer.

Referring to FIG. 1, an exemplary substrate (10) having a group III nitride epilayer (12) is generally shown. As shown, a buffer layer (14) is positioned between the group III nitride epilayer (12) and the base layer (16). Thus, the group III nitride epilayer (12) is applied adjacent to the buffer layer (14) overlying the base layer (16). While the exemplary substrate (10) is shown having only 3 layers, it should be understood that any substrate having a group III nitride epilayer can be subjected to the processes presently described. Thus, the particular substrate is not intended to be limited by the examples described herein.

Generally, the buffer layer (14) is used to accommodate for the large lattice and thermal mismatch between the group III nitride epilayer (12) and the base layer (16). The buffer layer (14) can be made of a Group III-Nitride material, such as $Al_xIn_yGa_{1-x-y}N$, wherein $0 \leq x \leq 1$, $0 \leq y \leq 1$, and $0 \leq x+y \leq 1$), using at least one of the following techniques: MOCVD, HVPE, MOHVPE, PALE, PLOG, or any combination of any of the deposition methods. For example, thin AlN buffer layers can be used to absorb the lattice mismatch between the GaN film and a Si substrate. Alternatively, AlGaN layers can be used as templates for the growth of GaN on a Si substrate. However, any suitable buffer layer (14) can be used in accordance with the present invention.

In addition to controlling the composition and thickness of buffer layer (14) and group III-nitride layer (12), the use of PALE results in the reduction of basal stacking faults. By adjusting the pulse time, pulse condition, flow rate and therefore chemical availability on the surface, the number of basal stacking faults on the surface is increased or decreased. In the present invention, by simply changing the number of aluminum, indium, gallium and ammonia pulses in a unit cell and the number of unit cell repetition, the basal stacking fault is significantly reduced.

In some embodiments, the buffer layer (14) is deposited on a substrate (16) using PALE growth method and the group III-nitride layer (12) is deposited on the buffer layer using MOHVPE technique. In some embodiment, the buffer layers (14) is deposited on a substrate (16) using MOHVPE growth mode and the group III-nitride layer (12) is deposited on the buffer layer (14) using PALE growth technique. In some embodiments, the buffer layer (14) and group III-nitride layer (12) is deposited using PALE growth method. In another embodiment, the buffer layer (14) and group III-Nitride layer is deposited using MOHVPE growth mode. In one particular embodiment, the buffer layer (14) is a short period superlattice layer of $Al_xIn_yGa_{1-x-y}N/Al_rIn_sGa_{1-r-s}N$ deposited using pulse atomic layer epitaxy, where the composition of $Al_x$-

$In_yGa_{1-x-y}N$ is different from $Al_rIn_sGa_{1-r-s}N$, and where $0 \leq x \leq 1$, $0 \leq y \leq 1$, $0 < x+y \leq 1$, $0 < r \leq 1$, $0 \leq s \leq 1$, and $0 < r+s \leq 1$.

III. Dielectric Masking by Digital Dielectric Deposition (DDD)

No matter the particular composition of the group III-nitride layer (12), or the method of growing it on the base layer (16), a dielectric mask (typically silicon dioxide or silicon nitride) is applied to selected areas of the group III nitride epilayer (12). The dielectric mask can be, in one embodiment, a layer of silicon oxide or silicon oxynitride that is overlaid on the group III nitride epilayer (12) only at selected areas, leaving the group III nitride epilayer (12) partially exposed. Although any method of applying a silicon dielectric mask partially over the group III nitride epilayer (12), two different methods are discussed in greater detail below.

A. Selective Silicon Masking of Group III Nitride Epilayer Utilizing Etching

The first process of forming a silicon dielectric mask for the pulsed lateral growth on the substrate (10) involves forming a silicon dielectric layer on the group III nitride epilayer (12), lithography, and etching. This process is described sequentially in FIGS. 2-5 and in the following discussion to form the substrate (10) having a silicon dielectric mask on the group III nitride epilayer (12), as shown in FIG. 6.

Figure 2:
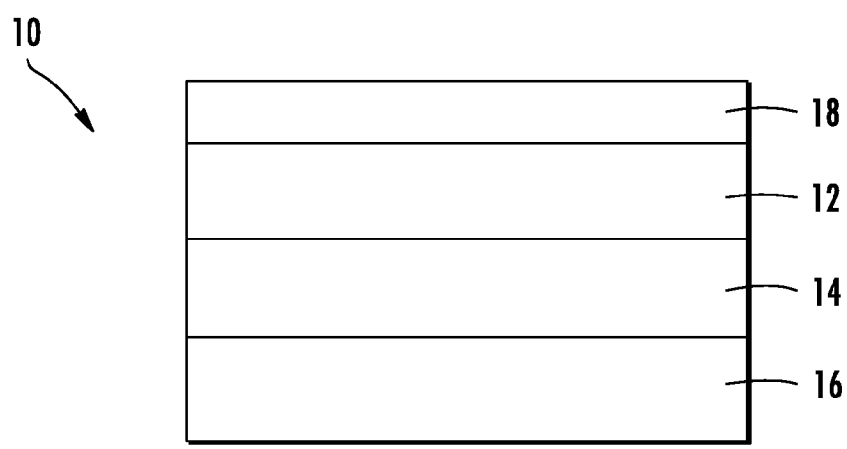
FIGS. 2-5 sequentially show intermediate substrates formed via an exemplary process of selectively masking the group III nitride epilayer utilizing etching.

Starting with an exposed group III nitride epilayer (12) on the substrate (10), a dielectric layer (18) is grown over the group III nitride epilayer (12), such as shown in FIG. 2. In one particular embodiment, the dielectric layer is formed from silicon oxide or a silicon nitride through a Digital Dielectric Deposition (DDD) technique. The DDD process can also be described as digital oxide deposition (DOD) and/or digital nitride deposition (DND). The DDD process is described in U.S. patent application Ser. No. 11/800,712 of Khan, et al., filed on May 7, 2007, which is incorporated by reference herein.

Generally, the DOD process involves alternating the application of silicon and oxygen (and/or a nitrogen source) to the substrate in a PECVD growth chamber to form a silicon dioxide dielectric layer. Accordingly, the silicon source and the oxygen source are applied independently from each other. For example, the substrate is first exposed to the silicon source gas, without any oxygen source present. Following purging of the silicon source gas (e.g., through a vacuum and/or purge gas), the substrate is exposed to the oxygen source gas, without any silicon source present. However, the order of exposure to the source gases can be altered such that the substrate is first exposed to the oxygen source, without any silicon source present, followed by the silicon source without any oxygen source present. In typical embodiments, the RF power of the PECVD chamber during the deposition process is from about 5 W to about 300 W.

In each DOD cycle, a silicon source and an oxygen source are each individually and sequentially applied to the substrate. Together, these individual applications form a thin layer of silicon dioxide on the surface of the substrate. The amount of silicon and oxygen applied per cycle can be controlled in a variety of ways in a conventional PECVD chamber, including but not limited to, the composition of the source gas, the concentration of the source gas, the length of exposure for each pulse of source gas, the total flow of the source gas per pus as regulated by a mass flow controller, and the temperature of the source gas and/or substrate.

However, the silicon source gas and the oxygen or nitrogen source gas do not have to be applied sequentially and independently, but can be applied with overlapping pulses such that the oxygen or nitrogen source are pulsed while the silicon source is either continuously injected into the deposition chamber or is pulsed such that an overlap in time exists between the silicon and oxygen or nitrogen pulse. Thus, there may exist in each DOD or DND cycle some time by which the silicon source is injected into the deposition chamber when the oxygen or nitrogen source are not injected into the deposition chamber to facilitate the surface mobility of the silicon source gas that is referred to in the previous embodiment.

The resulting thickness of each cycle of alternating silicon source and oxygen source typically results in a deposition layer having a thickness of less than about 5 nanometers, such as from about 0.5 to about 3 nm, and in some embodiments, between about 1 to about 2 nanometers, such as from about 1 to about 1.5 nanometers. Thus, the thickness of the entire deposition layer can be controlled by the number of cycles performed. As a result, any desired thickness of the deposition layer can be achieved by regulating the number of cycles performed on the substrate. In some embodiments, the thickness of the resulting dielectric layer (18) can range from about 50 angstroms (Å) to about 250 Å, such as from about 100 Å to about 200 Å. In particular embodiments, the thickness of the resulting dielectric layer (18) can range from about 50 angstroms (Å) to about 5000 Å, such as from about 100 Å to about 2000 Å.

The source gases are applied to the substrate in a chamber at a controlled temperature. Controlling the temperature of the chamber can allow control of the amount and thickness of each deposited layer. Typically, the temperature range of the chamber ranges from about 65° C. to about 350° C., such as from about 150° C. to about 325° C. In certain embodiments, the temperature within the chamber can be from about 200° C. to about 300° C., and in some embodiment, from about 225° C. to about 275° C. In yet another embodiment, the temperature within the chamber can be from about 65° C. to about 190° C. The temperature on the surface of the substrate generally follows the temperature of the chamber.

The silicon for the dielectric layer can be provided from any suitable silicon source. Typically, in PECVD chambers, the silicon source is provided in gaseous state. Suitable silicon source gases include, without limitation, silane gas (SiH4), disilane (Si2H6), diethlysilane (DES), tetraethyl-ortho-silicate (TEOS), chlorosilane compounds, or mixtures thereof. Chlorosilane compounds can include, for example, dichlorosilane (Si2Cl2H2), hexachlorosilane (Si2Cl6), silicon tetrachloride (SiCl4), chlorosilane (SiClH3), trichlorosilane (SiCl3H), or combinations thereof. In addition to the silicon source, the silicon source gas can include other, non-oxidizing additives. For example, a reducing agent can be included in the silicon source gas. Reducing agents can facilitate the deposition of silicon on the surface of the substrate. Common reducing agents include, but are not limited to, hydrogen (H2) gas, nitrogen (N2), and inert gases such as helium (He) and argon (Ar). Alternatively, the silicon source gas can be composed only of (or essentially only of) the silicon source.

Likewise, the oxygen for the dielectric layer can be provided from any suitable oxygen source. Typically, in chambers, the oxygen source is provided in gaseous state. Suitable oxygen source gases include, without limitation, oxygen gas (O2), nitrous oxide (N2O), ozone (O3), water vapor (H2O), or mixtures thereof. In some embodiments, the oxygen source gas can be composed only of (or essentially only of) the oxygen source. Alternatively, the oxygen source gas can also include reducing agents (e.g., H2 and N2) and/or inert gases (e.g., He and Ar).

Additionally, the amount of silicon and oxygen applied in each cycle can be controlled by the length of exposure of the source gases to the substrate. In each cycle, the silicon source gas and the oxygen source gas can be alternatively and independently exposed to the substrate for up to about a minute (i.e., 60 seconds). However, in most embodiments, a shorted period is all that will be required to produce a dielectric layer having a sufficient thickness. For example, the source gas can be exposed to the surface of the substrate for up to about 30 seconds, from about 0.1 seconds to about 10 seconds. In some particular embodiments, the pulse period for each source gas ranges from about 0.5 seconds to about 5 seconds, such as from about 1 second to about 3 seconds.

The respective pulses of the silicon source and the oxygen source can be controlled via a computerized system (i.e., digitally). As such, the amount of respective source gases applied to the substrate can be more precisely controlled, leading to greater control of the thickness of the resulting silicon dioxide layer(s).

No matter the amount or composition of the oxygen source gas applied to the substrate, the oxygen source is allowed to react with the silicon present on the surface of the substrate. Through this oxidation, the silicon deposited on the surface reacts with the oxygen source gas to form silicon dioxide. As stated, this layer of silicon dioxide formed from at least one cycle of alternating silicon and oxygen sources applied to the substrate, forms a dielectric layer on the substrate.

Although the above discussion references silicon dioxide, it should be understood that the reaction stoichiometry may be varied. As such, the dielectric layer may be formed from a silicon oxide material having the structure $Si_xO_y$, where x is an integer that is at least one (such as from 1 to 5) and y is a number from about 0.5 to about 6, such as from about 1 to about 5. Thus, the resulting dielectric layer may include other silicon oxide materials that vary in stoichiometry from $SiO_2$, but have similar properties.

In one embodiment, a nitrogen source can be substituted for or added to the oxygen source. Thus, the resulting dielectric layer can include silicon nitride molecules, such as $SiN_2$ or a stoichiometric variance thereof. For example, the silicon nitride can have the formula $Si_uN_v$, where $1 \leq u \leq 5$ and $2 \leq v \leq 8$. Thus, the dielectric layer can include either silicon oxide or silicon nitride molecules, or a combination of the two. For example, silicon oxynitride is also a suitable dielectric material (typically SiON, but can also include $Si_uO_yN_v$, where $1 \leq u \leq 5$, $1 \leq y \leq 10$, and $1 \leq v \leq 10$).

Figure 3:
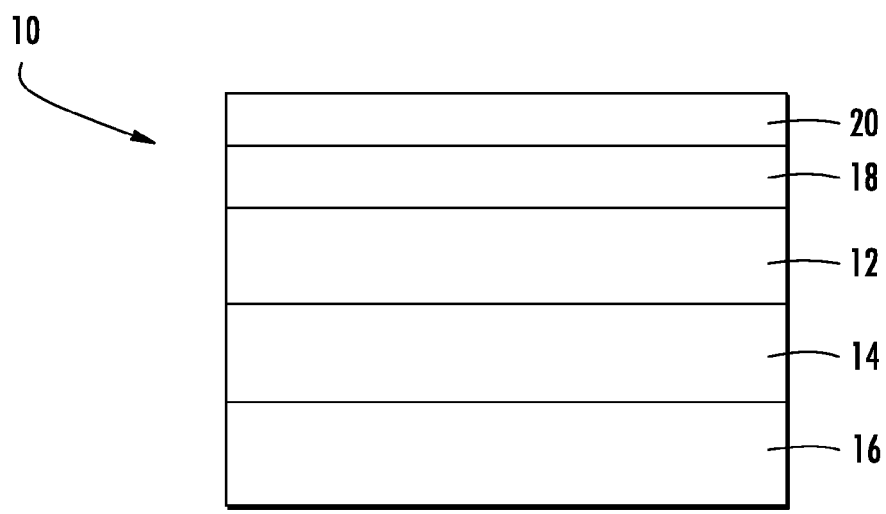
Figure 4:
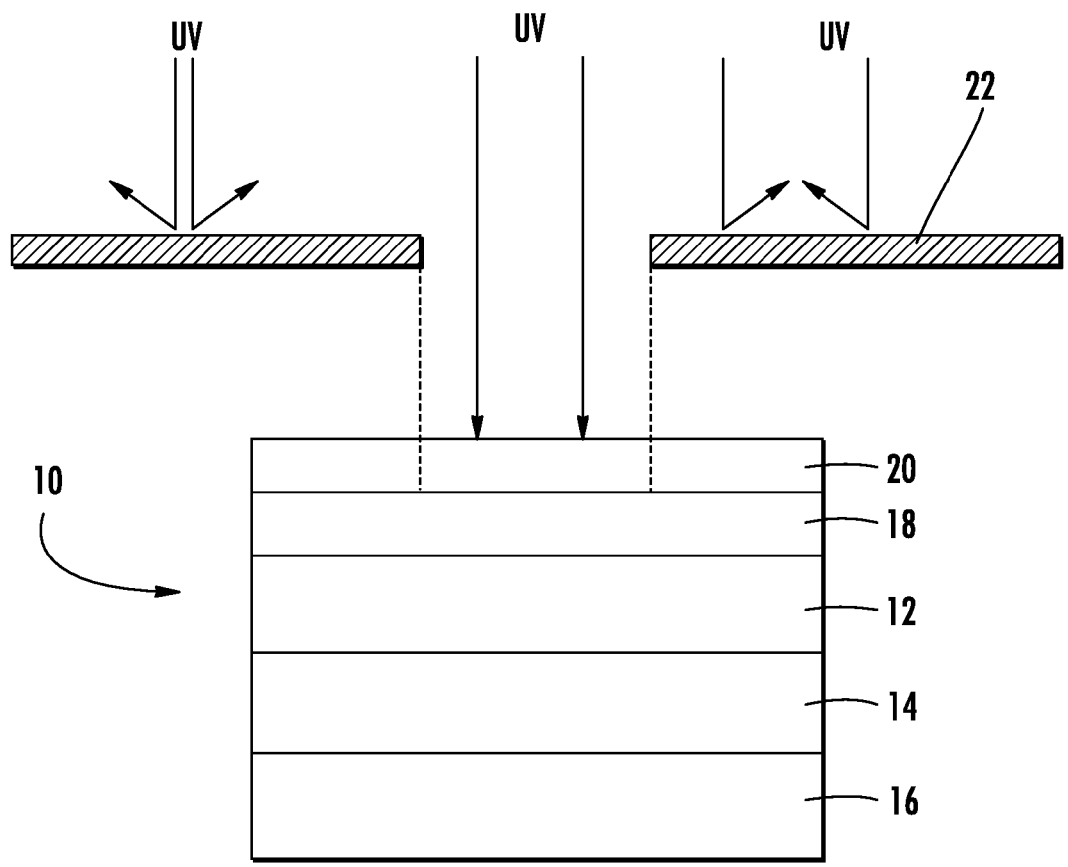

No matter the application method, the dielectric layer (18) is uniformly applied over the group III nitride epilayer (12). Then, select area(s) of the dielectric layer (18) are removed from the substrate (10) using lithography techniques. In one embodiment, a photo-resist coating (20) is applied uniformly over the dielectric layer (18), such as shown in FIG. 3. The photo-resist coating (20) can generally be composed of three basic elements: a base or resin, a solvent, and a polymer. As is well known in the art, exposing such photo-resist layers to ultra-violet radiation (e.g., wavelengths around 365 nm), the polymer properties can be substantially changed and/or altered.

In a general process of applying the photo-resist coating (20), the substrate (10) is initially heated to a temperature sufficient to drive off any moisture that may be present on the surface. A liquid or gaseous "adhesion promoter", such as hexamethyldisilazane (HMDS), can then be applied to promote adhesion of the photo-resist coating (20) to the substrate (10). The photo-resist coating (20) can be applied by spin-coating on a spinner. As is known in the art, spin-coating involves dispensing a viscous, liquid solution of photoresist onto the substrate (10), followed by spinning the substrate (10) to produce a substantially uniform photo-resist layer (20). The spin coating typically runs at 1200 to 4800 rpm for 30 to 60 seconds, and produces a layer between 2.5 and 0.5 micrometers thick. After application of the photo-resist layer (20), the substrate (10) can then be "soft-baked" or "prebaked" to drive off excess solvent, typically at 90 to 100° C. for 5 to 30 minutes. An oven or a hot-plate can be used.

Then, a mask may be placed over the photo-resist coating (20) overlying the dielectric layer (18) of the substrate (10) such that select portions of the photo-resist coating (20) are exposed, while other portions of the photo-resist coating (20) are shielded by the mask. These shielded areas of the photo-resist coating (20) will ultimately correspond to the areas doped by the dielectric layer (18) in the group III nitride epilayer (12). After positioning the mask over the substrate (10), the mask and substrate combination is irradiated with an energy source (e.g., ultraviolet light). In its basic form, the "mask" serves to shield at least one area or section of the substrate from the irradiating energy source and to expose at least one adjacent section to the energy source. For example, the mask may be a generally transparent or translucent blank (e.g., a strip of material) having any pattern of shielded regions printed or otherwise defined thereon. The transparent/translucent, unshielded regions of the mask correspond to the exposed areas of the substrate member. Alternatively, the mask may simply be an object or objects placed over the substrate. Regardless of the particular type of mask utilized, it should be understood that any pattern can be utilized to form the desired selectively doped regions.

The energy source may be, for example, a light source, e.g., an ultraviolet (UV) light source, an electron beam, a radiation source, etc. In a "positive" photo-resist coating (20), the energy source irradiates the exposed areas of the photo-resist coating (20) such that these portions can be removed from the substrate (10) to expose the underlying dielectric layer (18) in those selected areas. For example, referring to FIG. 4, a mask (22) is shown shielding portions of the photo-resist coating (20), while leaving the center portion of the photo-resist coating (20) exposed. Thus, when the energy source (represented by UV light) is applied to the masked substrate (10), the energy source (UV) only contacts the exposed center area of the photo-resist coating (20).

In this positive photo-resist coating (20), the energy source activates the exposed areas of the photo-resist coating (20) so that these activated areas can be removed. More specifically, the energy source causes a chemical change that allows that portion of the photo-resist layer (20) to be removed by a special solution, referred to as a "developer". In one embodiment, a metal-ion-free developer, such as tetramethylammonium hydroxide (TMAH), can be used to remove the activated portion of the photo-resist layer (20).

Alternatively, a "negative" photo-resist coating (20) can be utilized in accordance with the present invention. In this negative photo-resist coating (20), the energy source irradiates the exposed areas of the photo-resist coating (20) such that these portions become more robust, and less susceptible to removal from the substrate (10). Thus, the inactivated portions of the negative photo-resist coating (20) can be removed to expose the underlying dielectric layer (18) in those selected areas.

Once the select areas of the photo-resist coating (20) are removed, the underlying dielectric layer (18) is exposed in those select areas. For example, referring to FIG. 5, the center portion of the dielectric layer (18) is exposed, while the portions of the photo-resist coating (20) that were shielded by the mask (22) remain overlying the dielectric layer (18).

Figure 5:
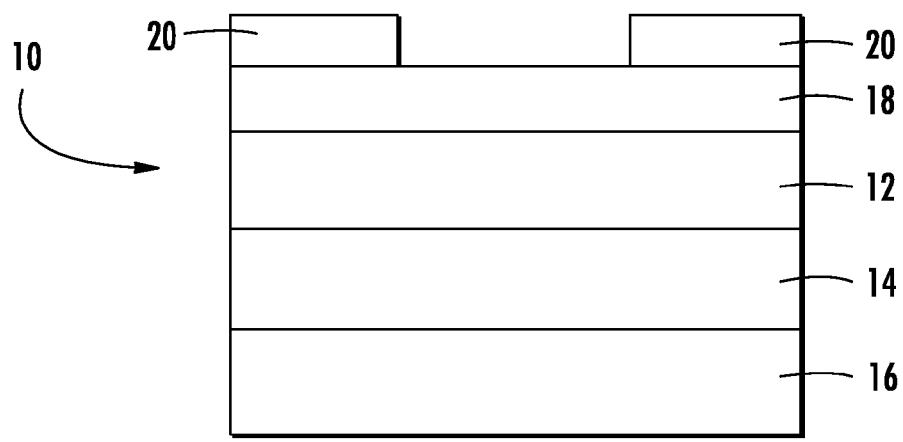
Figure 6:
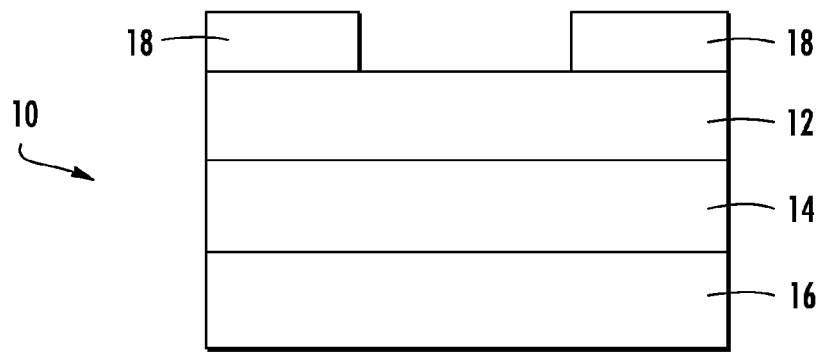
FIG. 6 shows an exemplary substrate with selective masking of the group III nitride epilayer.

Finally, the substrate (10) of FIG. 5, with the dielectric layer (18) exposed in select areas and with the photo-resist coating (20) overlying the dielectric layer (18) in other areas, is subjected to an etching process to remove the remaining photo-resist coating (20) and to remove the exposed dielectric layer (18) from the substrate (10).

Generally, etching can be performed by either of two methods known in the art: (a) dry etching or (b) wet etching. In the dry etching technique, a reactive ion bombardment of chemical species are used to impinge on the surface with high energy. The chemical species can be, for example, fluorine ions from sources such as silicon hexafluoride, carbon tetrafluoride, etc. Due to the collision and chemical reactions, the exposed material is either etched away or sputtered away. The same can be achieved by employing even higher power density of ion species by involving inductively coupled plasma techniques whereby a very high radio-frequency (RF) power source is utilized in conjunction with a reactive ion coil. In the wet etching, a chemical is used to react chemically with the exposed areas to remove the undesired portions. Typically, the chemical is either an acid (e.g., hydrofluoric acid) or a base.

After etching, the substrate (10) is left with the dielectric layer (18) only in the areas corresponding to those shielded from the energy source by the mask. Thus, the areas that were exposed to the energy source have no dielectric layer (18) remaining, leaving the group III nitride epilayer (12) exposed in those areas. For example, referring to FIG. 6, the substrate (10) is shown having the dielectric layer (18) remaining only in those areas corresponding to those shielded by the mask, while the center portion of the group III nitride epilayer (12) is exposed (corresponding to the area exposed to the energy source).

B. Selective Silicon Masking of Group III Nitride Epilayer Through Lift Off

In some embodiments, it can be advantageous to avoid the use of any etching process prior to the doping step because the etching process may damage the underlying layers (e.g., the group III nitride epilayer). The present inventors have discovered a process that enables the group III nitride epilayer to be doped without the need for an etching process. Accordingly, through the use of a lift off technique that takes advantage of the DDD process, etching processes can be avoided until after the group III nitride epilayer has been doped.

In this lift off method, the substrate shown in FIG. 1 is subjected to several process steps, resulting in the intermediate substrates (shown sequentially in FIGS. 7-11) to result in substantially the same intermediate substrate shown in FIG. 6, having the dielectric layer (18) remaining on the areas of the group III nitride epilayer (12).

Figure 7:
FIGS. 7-11 sequentially show intermediate substrates formed via an exemplary process of selectively masking the group III nitride epilayer utilizing lift off.

In this embodiment, a photo-resist coating is first applied over the group III nitride epilayer (12) exposed on the substrate (10). Referring to FIG. 7, a photo-resist coating (20) is shown overlying the group III nitride epilayer (12) of the substrate (10).

Figure 8:
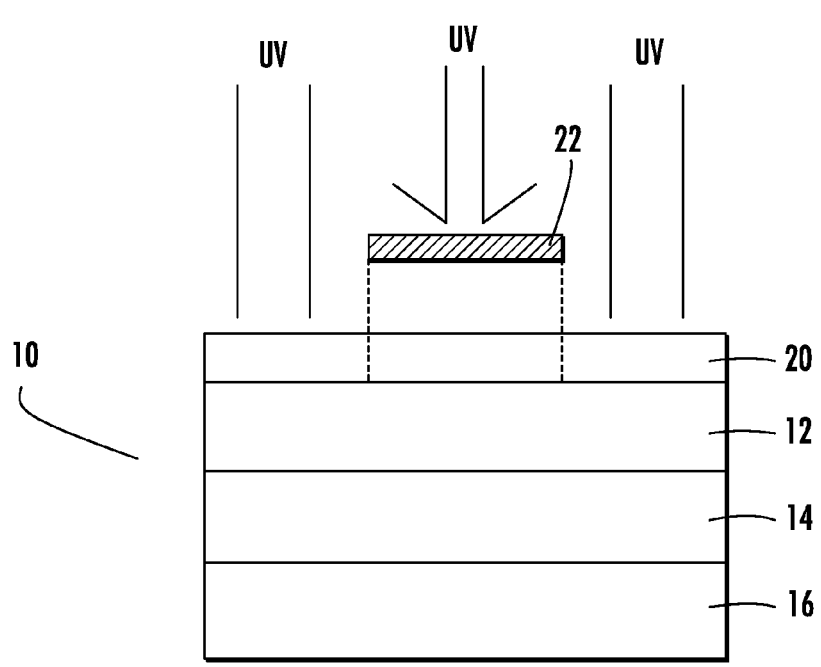

Next, a mask (22) is positioned over the photo-resist coating (20), as shown in FIG. 8. However, in this embodiment, the areas of the photo-resist coating (20) exposed by the mask (22) correspond to the areas that will ultimately be masked with a silicon dielectric layer. Likewise, the areas of the photo-resist coating (20) shielded by the mask (22) correspond to those areas that will be free of any silicon dielectric layer. An energy source (e.g., UV light) is applied to the mask (22) and substrate (10) combination to form activated areas that correspond to those areas to be masked with a silicon dielectric layer.

Figure 9:
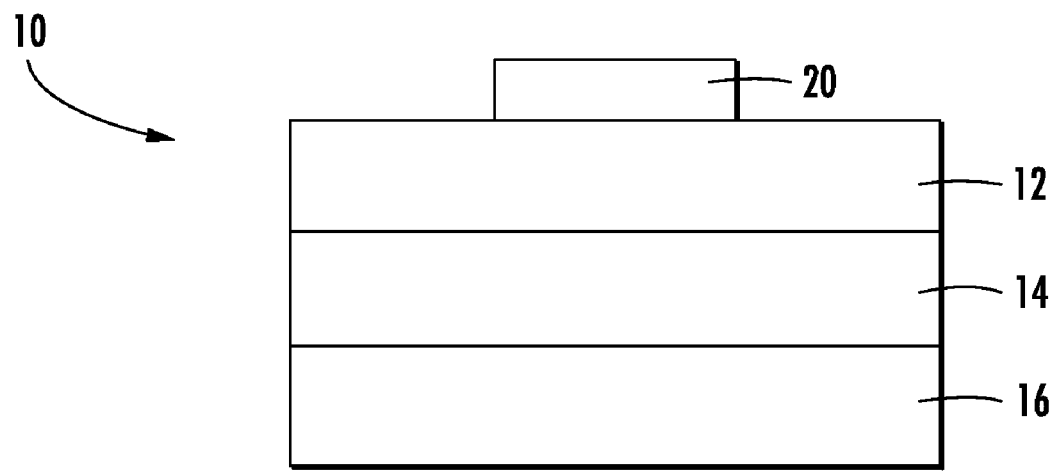

After exposure to the energy source, the activated areas of the photo-resist coating (20) are removed from the substrate (10) to leave exposed areas of the group III nitride epilayer (12), such as shown in FIG. 9. These exposed areas of the group III nitride epilayer (12) are the areas that will be masked with a silicon dielectric layer.

Figure 10:
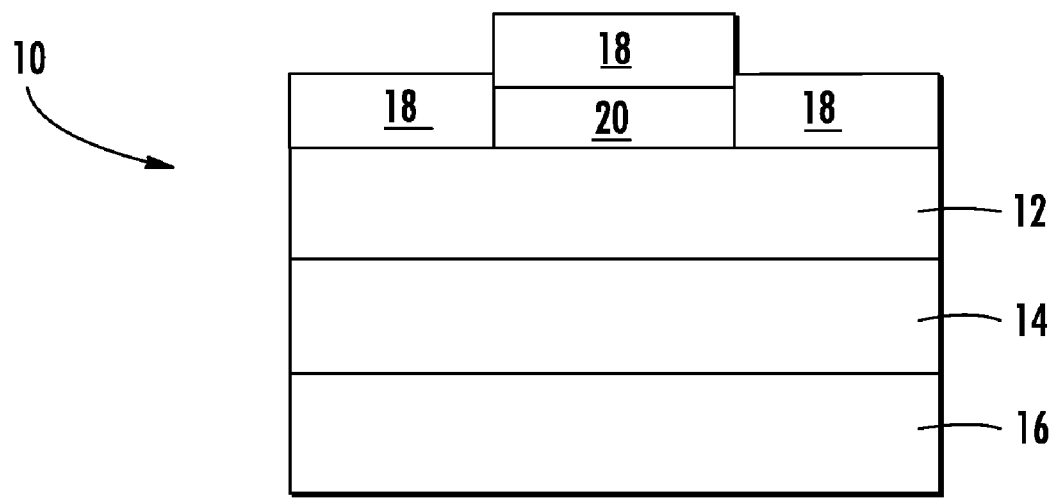

Following removal of the activated areas of the photo-resist coating (20), a dielectric layer (18) is grown to overly the exposed group III nitride epilayer (12) and the remaining photo-resist coating (20), as shown in FIG. 10. In order to grow the dielectric layer (18) without damaging the remaining photo-resist coating (20), a DDD process is utilized because this process can be performed at relatively low temperatures. Other deposition processes require a relatively high deposition temperature which would most likely bake and damage (e.g., crack, remove, carbonize, etc.) the remaining photo-resist coating (20), probably rendering the photo-resist coating (20) ineffective. For example, the dielectric layer (18) can be applied over the group III nitride epilayer (12) and remaining photo-resist coating (20) at a temperature of less than about 500° C., such as less than about 300° C., and in some embodiments less than about 150° C.

Figure 11:
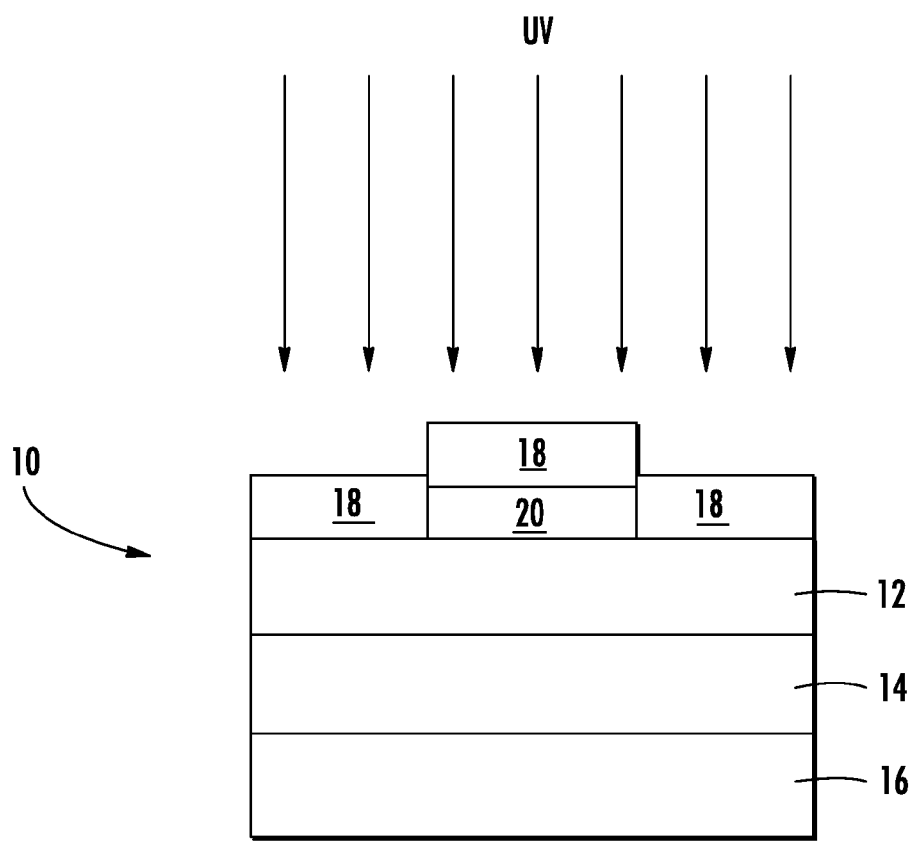

Finally, an energy source can be applied to the entire substrate (10) to activate all of the remaining photo-resist coating (20), as shown in FIG. 11. Thus, the remaining photo-resist coating (20) positioned between the group III nitride epilayer (12) and the dielectric layer (18) becomes activated. The activated photo-resist coating (20) and the dielectric layer (18) overlying it can then be removed through the use of a removal solution. As a result, only the dielectric layer (18) that was applied directly to the exposed group III nitride epilayer (12) remains on the substrate (10), as shown in FIG. 6.

IV. Pulsed Lateral Overgrowth

After the formation of the silicon dielectric masked group III nitride epilayer (12), such as shown in FIG. 6, a PLOG group III nitride epilayer is grown on the exposed group III nitride epilayer (12) remaining on the exemplary substrate (10). This PLOG group III nitride epilayer is grown according to pulsed lateral overgrowth technique. As discussed above, pulsed lateral overgrowth (PLOG) is a technique wherein a Group III comprising material (e.g., triethyl gallium or trialkyl aluminum) and a nitrogen material (e.g., ammonia) are supplied in a vapor phase for deposition of the Group III nitride. With pulsed lateral overgrowth the flow rate of the Group III material is maintained at a constant rate whereas the flow rate of the nitrogen compound is systematically altered, preferable from full flow to off, in a predetermined sequence as set forth in "Vertically Faceted Lateral Overgrowth of GaN on SiC with Conducting Buffer Layers Using Pulsed Metalorganic Chemical Vapor Deposition", Fareed et al., *Applied Physics Letters*, Vol. 77, Number 15, 9 Oct. 2000, page 2343-5, which is incorporate by reference herein. By controlling the flow rate, and therefore chemical availability, of the nitrogen systematic growth of select crystallographic planes can be accomplished. The systematic growth provides a layer which significantly mitigates transfer of dislocations caused by lattice mismatches through the layer.

Figure 12:
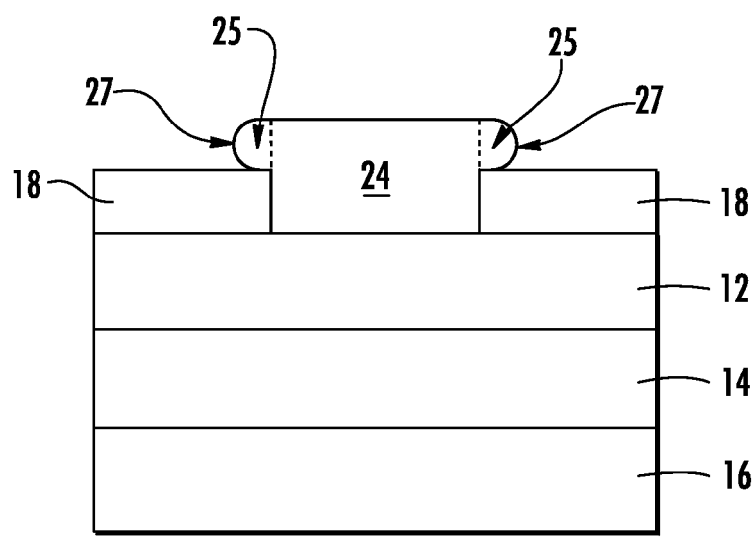
FIG. 12 shows an exemplary substrate having a mushroom-shaped PLOG group III nitride epilayer.

As the PLOG group III nitride epilayer is grows, it eventually overgrows the silicon dielectric mask, allowing for lateral growth of the PLOG group III nitride epilayer. Thus, the PLOG group III nitride epilayer grows begins to overgrow the silicon dielectric mask, as shown in FIG. 12. In the shown embodiment of FIG. 12, the PLOG group III nitride epilayer (24) is grown on the masked group III nitride epilayer (12). Initially, the PLOG group III nitride epilayer (24) grows on the group III nitride epilayer (12) between the remaining silicon dielectric epilayer 18. Then, when the PLOG group III nitride epilayer (24) outgrows the remaining silicon dielectric epilayer 18, the PLOG group III nitride epilayer (24) begins to grow laterally. This lateral growth of the PLOG group III nitride epilayer (24) creates laterally grown portions 25 of the PLOG group III nitride epilayer (24).

Since the growth of the PLOG group III nitride epilayer (24) is conducted by pulsing the source gases, the extent of the growth can be precisely controlled. Thus, the growth of the PLOG group III nitride epilayer (24) can be halted before the laterally grown portion 25 merges with another laterally grown portion 25, leaving a mushroom-shaped PLOG group III nitride epilayer (24).

Alternatively, the growth of the PLOG group III nitride epilayer (24) can be continued for a period sufficient to allow adjacent mushroom-shaped PLOG group III nitride epilayer (24) to create a uniform PLOG group III nitride epilayer (24) overlaying the exemplary substrate (10). In this embodiment, the PLOG group III nitride epilayer (24) has laterally grown portions (25) directly overlaying the remaining silicon dielectric epilayer (18).

V. Growing the III-Nitride Layer Via Pulsed Selective Area Lateral Epilayer (P-SALE)

Figure 13:
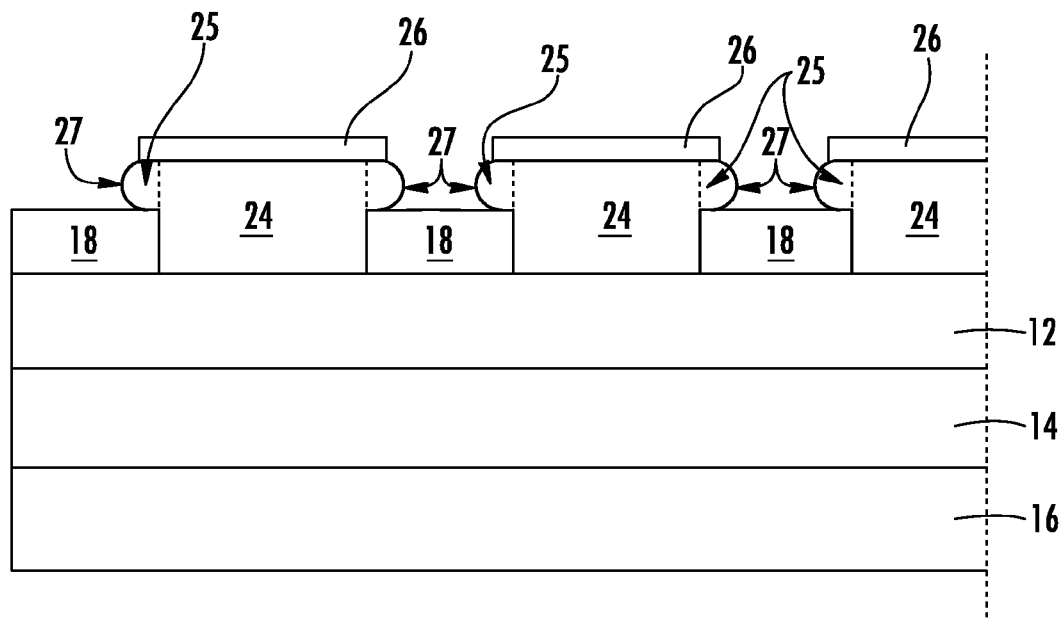
FIG. 13 shows an exemplary substrate as in FIG. 12, where the mushroom-shaped PLOG group III nitride epilayer is masked with a silicon dielectric layer.

When the growth of the PLOG group III nitride epilayer (24) is halted before the laterally grown portion 25 merges with another laterally grown portion 25 to leave a mushroom-shaped PLOG group III nitride epilayer (24), as shown in FIG. 12, the mushroom-shaped PLOG group III nitride epilayer (24) can be used as a template for growing a SALE group III nitride epilayer. In this embodiment, the mushroom-shaped PLOG group III nitride epilayer (24) is masked with a second silicon dielectric layer (26), as shown in FIG. 13. Any of the above DDD processes described above can be used to grow the second silicon dielectric layer (26).

After masking, a SALE group III nitride epilayer (28) can be grown. This SALE group III nitride epilayer (28) is preferably grown utilizing the pulsed atomic layer epitaxy process, so that the composition and growth rate can be controlled. The present inventors have termed the process of selective area lateral epilayer growth using a pulse atomic layer epitaxy (PALE) deposition method as "Pulsed Selective Area Lateral Epitaxy (PSALE)". Due to the masking of the PLOG group III nitride epilayer (24) with the second silicon dielectric layer (26), the side edges 27 of the mushroom-shaped PLOG group III nitride epilayer (24) are exposed and available for epitaxy growth. Thus, the resulting SALE group III nitride epilayer (28) is completely grown laterally. Specifically, the growth starts out from each side edge (27) of the mushroom-shaped PLOG group III nitride epilayer (24) and eventually merges with the growth out of an adjacent mushroom-shaped PLOG group III nitride epilayer (24) at merger point (32) as shown in FIG. 14.

A cavity 30 is left between adjacent PLOG group III nitride epilayers (24) in growing the PSALE group III nitride epilayer (28). In one embodiment of invention, the cavity has window has a triangular shape. In another embodiment, it is rectangular shaped cavity. However, by adjusting the pulse conditions, the cavity window opening shape can be square, rectangle, parallelogram, circular and triangle.

Additionally, a cavity 31 is formed above the dielectric layer (26) due to the lateral growth of the PSALE group III nitride epilayer (28). In one embodiment of invention, the cavity has window has a triangular shape. In another embodiment, it is rectangular shaped cavity. However, by adjusting the pulse conditions, the cavity window opening shape can be square, rectangle, parallelogram, circular and triangle.

Figure 14:
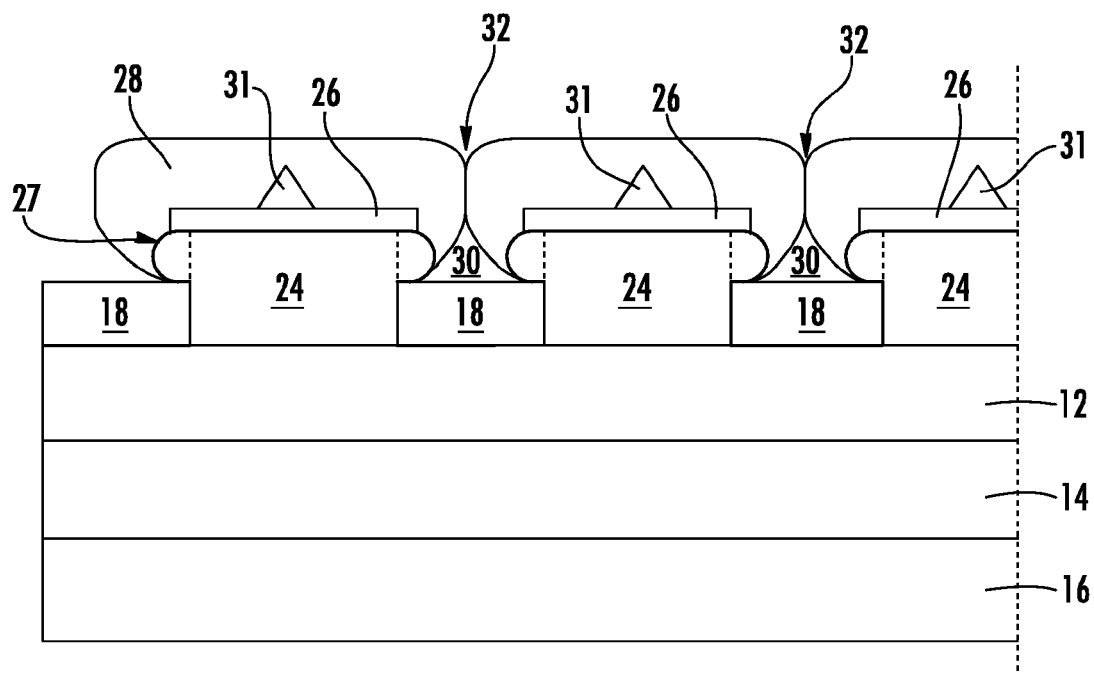
FIG. 14 shows the exemplary substrate of FIG. 14 having a PSALE group III nitride layer grown over the silicon dielectric masked PALE group III nitride.

This complete lateral growth of the PSALE group III nitride epilayer (28) results in an epilayer having a very low concentration of defects, including threading dislocations and basal stacking faults as shown in FIG. 14. By controlling the pulse conditions, the composition of ternary III-Nitrides such as $Al_xGa_{1-x}N$, $In_yGa_{1-y}N$ and $Al_zIn_{1-z}N$ and quaternary $Al_rIn_sGa_{(1-r-s)}N$ ($0 \leq r \leq 1$, $0 \leq r+s \leq 1$) can be controlled during the selective lateral overgrowth conditions for non-polar and semi-polar epitaxial layers and substrates.

Example 1

Figure 15A:
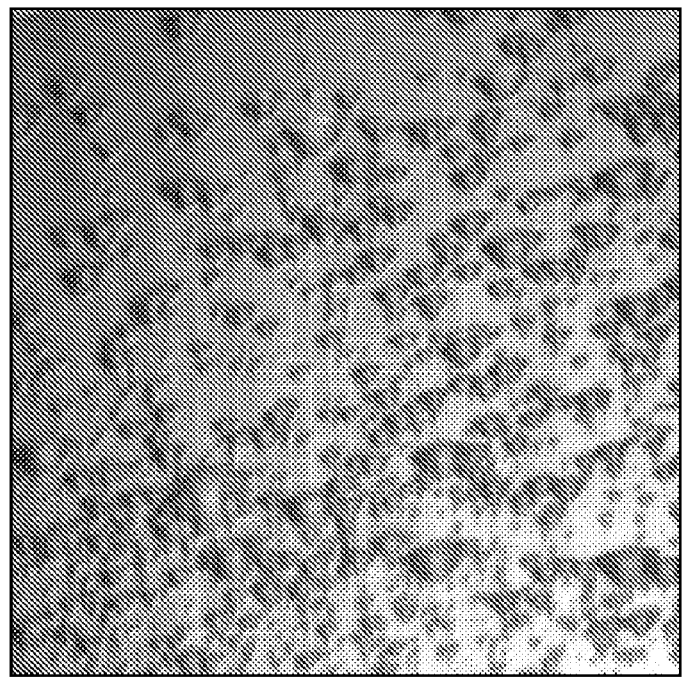
FIG. 15 shows the optical microscopic image of non-polar GaN grown by (a) conventional MOCVD and (b) pulse atomic layer epitaxy.
Figure 15B:
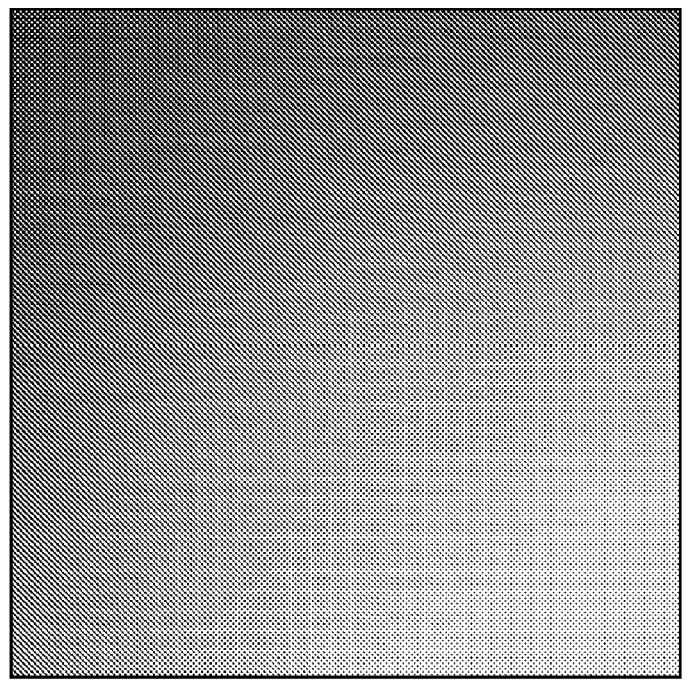

A 1.5 µm thick a-plane GaN films was deposited over r-plane sapphire substrates using pulse atomic layer epitaxy (PALE). The growth temperature was 990C and growth pressure was 40 torr. Tri-ethyl gallium and ammonia were used the precursors for pulse atomic layer epitaxy of GaN. By adjusting the pulse condition including the pulse time (0-100 secs), ramping time (0-100 secs), total flow of triethyl gallium (5-500 sccm) and ammonia (1-30 SLM), smooth GaN was achieved. The basal stacking faults seen in conventional MOCVD as seen in FIG. 15(a) are significantly reduced by using pulse atomic layer epitaxy shown in FIG. 15(b).

Figure 16A:
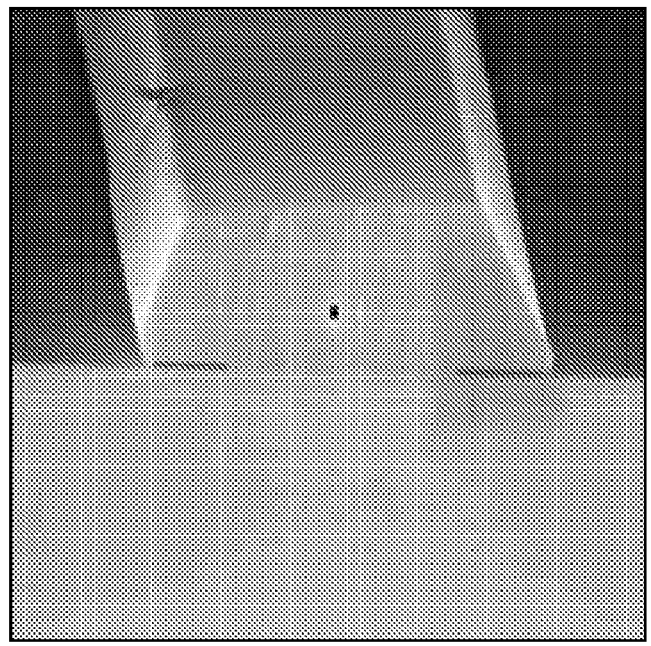
FIG. 16 shows the cross section scanning electron microscopic image of pulse selective lateral area overgrown A-plane GaN with two different V/III ratio (a) 500 and (b) 3000.
Figure 16B:
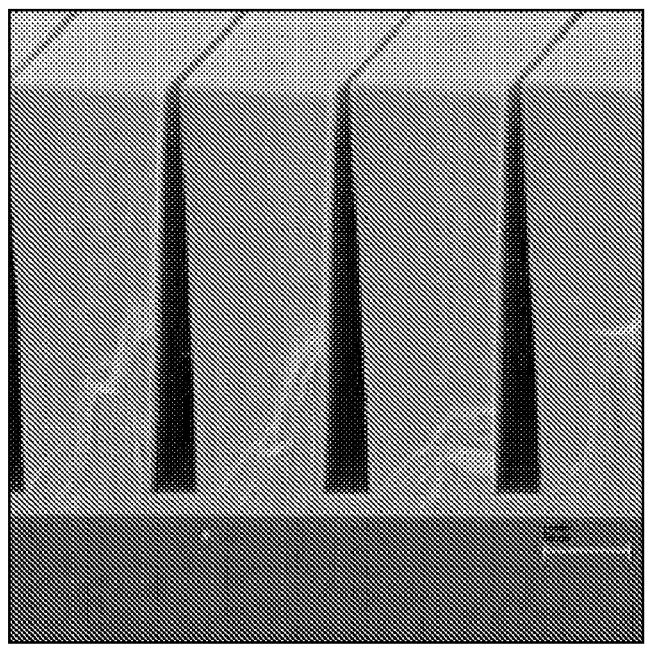
Figure 17:
FIG. 17 shows the plane view scanning electron microscope image of pulse selective area overgrown non-polar A-plane GaN with V/III ratio of 3000.
Figure 18:
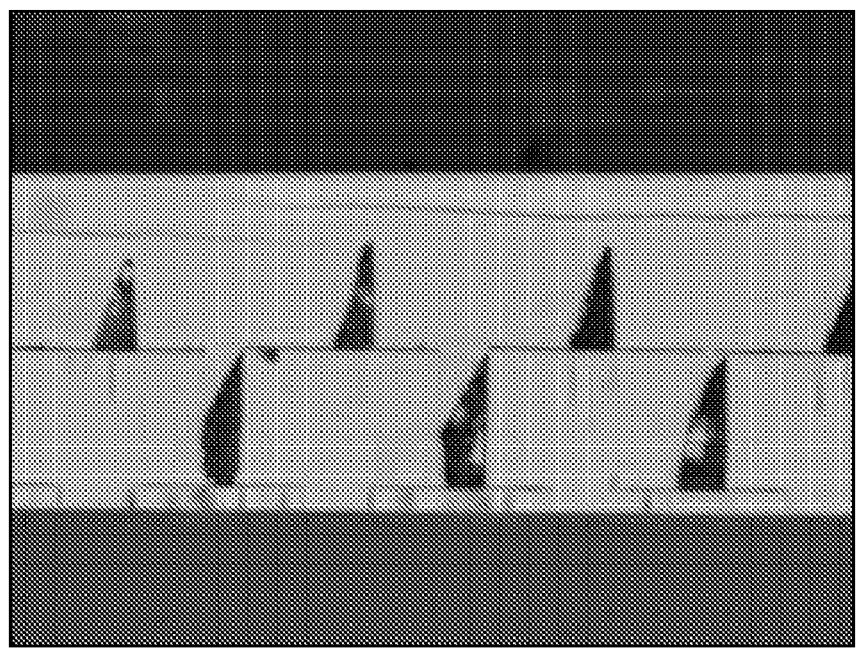
FIG. 18 shows the cross section scanning electron microscopic image of pulse selective lateral overgrown A-plane GaN with multiple step digital dielectric deposited $SiO_2$.

Selective area growth of GaN was carried out over a digital dielectric deposited $SiO_2$ mask using pulse selective area lateral epitaxy method. The geometrical parameters of the obtained structure were studied using scanning electron microscope (SEM). The $SiO_2$ stripe openings were 5 µm and the period was 15 µm. The openings were oriented along [1-100]. In pulse selective area lateral epitaxial growth of A-plane GaN, the growth temperature for this deposition was 1040° C. By pulsing the precursor sources such as trimethyl gallium and ammonia, the vertical to lateral growth rate can be controlled. In addition to the pulse selective area growth condition, the increase in growth temperature enhanced the vertical growth rate and hence resulted in a-plane GaN pillars with a high height/width aspect ratio as shown in FIGS. 16(a) and 16(b). Plane view surface image show significant reduction in surface stacking fault as shown in FIG. 17. After the pillar growth, a 0.3 µm thick $SiO_2$ layer was deposited on the pillar surfaces (standard photolithography and digital dielectric deposition technique). Additional GaN lateral growth was then carried out using similar pulsed growth conditions. This lateral growth proceeded from the pillar c-plane faces. The digital dielectric deposited $SiO_2$ stripes on the pillar top surface (a-plane) completely suppressed the vertical growth over areas with high threading dislocations. The PSALE process thus resulted in samples with fully coalesced a-plane GaN films as shown in FIG. 18.

The invention claimed is:

1. A method of growing a non-polar group III nitride layer on a base layer, the method comprising:
    masking the base layer with a first dielectric layer, wherein the first dielectric layer is located on select areas of the base layer such that a portion of the base layer is exposed;
    growing a mushroom-shaped PLOG group III nitride layer via pulse lateral overgrowth epitaxy on the portion of the base layer that is exposed, wherein the PLOG group III nitride layer grows over a portion of the first dielectric layer;
    masking the mushroom-shaped PLOG group III nitride layer with a second dielectric layer, wherein each side of the mushroom-shaped PLOG group III nitride layer remains exposed; and
    growing a nonpolar group III nitride layer from each exposed side of the mushroom-shaped PLOG group III nitride layer, wherein the nonpolar group III nitride layer is grown by pulsing a nitrogen source and a group III metal source.

2. The method as in claim 1, wherein the first dielectric layer masking the base layer is grown by pulsing a silicon source and an oxygen source.

3. The method as in claim 1, wherein the second dielectric layer masking the mushroom-shaped PLOG group III nitride layer is grown by pulsing a silicon source and an oxygen source.

4. The method as in claim 1, wherein the mushroom-shaped PLOG group III nitride layer is grown by pulsing a nitrogen source and a group III metal source.

5. The method as in claim 1, wherein the PLOG group III nitride layer comprises $Al_xIn_yGa_{1-x-y}N$, wherein $0 \leq x \leq 1$, $0 \leq y \leq 1$ and $0 < x+y \leq 1$.

6. The method as in claim 1, wherein the base layer comprises $Al_xIn_yGa_{1-x-y}N$, wherein $0 \leq x \leq 1$, $0 \leq y \leq 1$ and $0 < x+y \leq 1$.

7. The method as in claim 1, wherein the nonpolar group III nitride layer comprises $Al_xIn_yGa_{1-x-y}N$, wherein $0 \leq x \leq 1$, $0 \leq y \leq 1$ and $0 < x+y \leq 1$.

8. The method as in claim 1, wherein the base layer overlays a buffer layer and a substrate.

9. The method as in claim 8, wherein the buffer layer is deposited as a $Al_xIn_yGa_{1-x-y}N/Al_rIn_sGa_{(1-r-s)}N$ short period super lattice, wherein $0 \leq x \leq 1$, $0 \leq y \leq 1$, $0 < x+y \leq 1$, $0 < r \leq 1$, $0 \leq s \leq 1$ and $0 < r+s \leq 1$, and wherein x and r are different and y and s are different.

10. The method as in claim 1, wherein the nonpolar group III nitride layer is grown by sequentially pulsing a nitrogen source and a group III metal source.

11. A non-polar substrate formed according to the method of claim 1.

12. A non-polar substrate comprising
a non-polar material;
a buffer layer overlying the non-polar material;
a group III nitride base layer overlying the buffer layer, wherein the group III nitride base comprises $Al_xIn_yGa_{1-x-y}N$, wherein $0 \leq x \leq 1$, $0 \leq y \leq 1$ and $0 < x+y \leq 1$;
a first dielectric layer masking a portion of the group III nitride base layer, wherein a portion of the group ill nitride base layer remains unmasked;
a mushroom-shaped PLOG group III nitride layer grown on the unmasked portion of the group III nitride base layer, wherein the mushroom-shaped PLOG group III nitride layer overgrows a portion of the first dielectric layer;
a second dielectric layer masking the mushroom-shaped PLOG group III nitride layer, wherein each side of the mushroom-shaped PLOG group III nitride layer remains unmasked; and
a nonpolar group III nitride layer overlying exposed portions of the first dielectric layer and the second dielectric layer, wherein the nonpolar group III nitride layer is grown out of each unmasked side of the mushroom-shaped PLOG group III nitride layer by pulsing a nitrogen source and a group III metal source.

13. The non-polar substrate as in claim 12, wherein a cavity is defined between exposed portions of the first dielectric and the nonpolar group III nitride layer.

14. The non-polar substrate as in claim 12, wherein the nonpolar group III nitride layer comprises $Al_xIn_yGa_{1-x-y}N$, wherein $0 \leq x \leq 1$, $0 \leq y \leq 1$ and $0 < x+y \leq 1$.

15. The non-polar substrate as in claim 12, wherein the non-polar material comprises sapphire.

16. The non-polar substrate as in claim 12, wherein the nonpolar group III nitride layer is grown by sequentially pulsing a nitrogen source and a group III metal source.

17. A semipolar substrate comprising
a semi-polar material;
a buffer layer overlying the semi-polar material;
a group III nitride base layer overlying the buffer layer, wherein the group III nitride base comprises $Al_xIn_yGa_{1-x-y}N$, wherein $0 \leq x \leq 1$, $0 \leq y \leq 1$ and $0 < x+y \leq 1$;
a first dielectric layer masking a portion of the group III nitride base layer, wherein a portion of the group III nitride base layer remains unmasked;
a mushroom-shaped PLOG group III nitride layer grown on the unmasked portion of the group III nitride base layer, wherein the mushroom-shaped PLOG group III nitride layer overgrows a portion of the first dielectric layer;
a second dielectric layer masking the mushroom-shaped PLOG group III nitride layer, wherein each side of the mushroom-shaped PLOG group III nitride layer remains unmasked; and
a semi-polar group III nitride layer overlying exposed portions of the first dielectric layer and the second dielectric layer, wherein the semi-polar group III nitride layer is grown out of each unmasked side of the mushroom-shaped PLOG group III nitride layer by pulsing a nitrogen source and a group III metal source.

18. The semi-polar substrate as in claim 17, wherein a cavity is defined between exposed portions of the first dielectric and the semi-polar group III nitride layer.

19. The semi-polar substrate as in claim 17, wherein the semi-polar group III nitride layer comprises $Al_xIn_yGa_{1-x-y}N$, wherein $0 \leq x \leq 1$, $0 \leq y \leq 1$ and $0 < x+y \leq 1$.

20. The semi-polar substrate as in claim 17, wherein the semi-polar group III nitride layer is grown by sequentially pulsing a nitrogen source and a group III metal source.

* * * * *

UNITED STATES PATENT AND TRADEMARK OFFICE
CERTIFICATE OF CORRECTION

PATENT NO. : 8,338,273 B2  Page 1 of 1
APPLICATION NO. : 12/515991
DATED : December 25, 2012
INVENTOR(S) : Khan et al.

It is certified that error appears in the above-identified patent and that said Letters Patent is hereby corrected as shown below:

In the Claims

Column 15, Line 41, Claim 12, "...a portion of the group ill..." should read --...a portion of the group III...--.

Signed and Sealed this
Seventh Day of April, 2015

Michelle K. Lee
*Director of the United States Patent and Trademark Office*